(12) United States Patent
Nagahama et al.

(10) Patent No.: US 9,117,988 B2
(45) Date of Patent: Aug. 25, 2015

(54) LIGHT-EMITTING DEVICE

(71) Applicant: PANASONIC CORPORATION, Osaka (JP)

(72) Inventors: Katsuyuki Nagahama, Hyogo (JP); Yuya Yamamoto, Osaka (JP); Kentaro Yamauchi, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/474,634

(22) Filed: Sep. 2, 2014

(65) Prior Publication Data

US 2015/0084071 A1 Mar. 26, 2015

(30) Foreign Application Priority Data

Sep. 24, 2013 (JP) ................... 2013-197439

(51) Int. Cl.
*H01L 31/00* (2006.01)
*H01L 33/60* (2010.01)
*H01L 27/15* (2006.01)
*H01L 33/58* (2010.01)

(52) U.S. Cl.
CPC .............. *H01L 33/60* (2013.01); *H01L 27/153* (2013.01); *H01L 33/58* (2013.01); *H01L 2224/45144* (2013.01); *H01L 2224/48091* (2013.01); *H01L 2224/48227* (2013.01)

(58) Field of Classification Search
CPC ....... H01L 33/60; H01L 33/58; H01L 27/153; H01L 2224/48091; H01L 2224/48227; H01L 2224/45144; H01L 2924/00014; H01L 2924/45144; H01L 2924/00
See application file for complete search history.

(56) References Cited

U.S. PATENT DOCUMENTS 7,777,235 B2 * 8/2010 Mazzochette et al. .......... 257/81
2008/0142820 A1 * 6/2008 Edmond et al. ................ 257/98
(Continued)

FOREIGN PATENT DOCUMENTS

JP 2010-239043 10/2010
JP 2011-192959 9/2011
(Continued)

OTHER PUBLICATIONS

U.S. Appl. No. 14/387,703 to Yoji Urano et al., which was filed Sep. 24, 2014.
U.S. Appl. No. 14/388,963 to Yoji Urano et al., which was filed Sep. 29, 2014.

*Primary Examiner* — Victor A Mandala
*Assistant Examiner* — Quovaunda V Jefferson
(74) *Attorney, Agent, or Firm* — Greenblum & Bernstein, P.L.C.

(57) ABSTRACT

The light-emitting device of the disclosure includes at least one LED chip and a mounting substrate. The mounting substrate includes: a ceramic substrate; a reflection layer situated on a second surface on the opposite side of the ceramic substrate from a first surface; and a gas barrier layer covering the reflection layer. The LED chip is bonded to the first surface of the ceramic substrate. The ceramic substrate has light diffusion and transmissive properties and has a plan size larger than a plan size of the LED chip. The reflection layer has a plan size smaller than a plan size of the ceramic substrate and is formed so as to cover an area larger than a projected area of the LED chip on the second surface of the ceramic substrate.

8 Claims, 7 Drawing Sheets

(56) References Cited

U.S. PATENT DOCUMENTS

| | | |
|---|---|---|
| 2008/0191609 A1* | 8/2008 | Schmidt et al. ............... 313/503 |
| 2009/0315057 A1 | 12/2009 | Konishi et al. |
| 2011/0204398 A1 | 8/2011 | Tanida et al. |
| 2011/0278618 A1 | 11/2011 | Nakayama |
| 2015/0029725 A1* | 1/2015 | Kamikawa .................... 362/293 |
| 2015/0048402 A1* | 2/2015 | Urano et al. .................... 257/98 |

FOREIGN PATENT DOCUMENTS

| | | |
|---|---|---|
| JP | 2011-243660 | 12/2011 |
| JP | 2013-093635 | 5/2013 |
| JP | 2013-098516 | 5/2013 |

* cited by examiner

LIGHT-EMITTING DEVICE

CROSS-REFERENCE TO RELATED APPLICATIONS

The application is based upon and claims the benefit of priority of Japanese Patent Application No. 2013-197439, filed on Sep. 24, 2013, the entire contents of which are incorporated herein by reference.

TECHNICAL FIELD

The disclosure relates to light-emitting devices and particularly to a light-emitting device including at least one LED chip (light emitting diode chip).

BACKGROUND ART

In the past, as this type of light-emitting devices, there has been proposed, for example, a light-emitting device 101 having a structure shown in FIG. 11 (see document 1 [JP 2013-93635 A]).

The light-emitting device 101 includes a low temperature co-fired ceramics (LTCC) substrate 110, a silver reflection layer 103 formed on the LTCC substrate 110, a glass layer 104 to cover the silver reflection layer 103, and an LED chip 102 located on the glass layer 104. Further, the LED chip 102 and bonding wires 107 are encapsulated by a dome-shaped phosphor-containing encapsulating resin 108. The LTCC substrate 110 is constituted by a plurality of (ten) LTCC layers 110a to 110j. In the light-emitting device 101, the LTCC substrate 110 has a thickness of 1 mm, the silver reflection layer 103 has a thickness of 0.25 mm and the glass layer 104 has a thickness of 0.01 mm.

It is considered that light-outcoupling efficiency of the light-emitting device 101 is likely to decrease due to some causes such as absorption by the LED chip 102 and multiple reflection in the LED chip 102 regarding light emitted from the LED chip 102 and reflected by the silver reflection layer 103.

SUMMARY OF INVENTION

In view of the above insufficiency, the present invention has aimed to propose a light-emitting device which can improve light-outcoupling efficiency and reliability.

The light-emitting device of the disclosure includes: at least one LED chip; a mounting substrate on which the at least one LED chip is mounted; and a cover part which covers the at least one LED chip and allows light emitted from the at least one LED chip to pass through the cover part. The mounting substrate includes: a ceramic substrate; a reflection layer which is situated on a second surface on the opposite side of the ceramic substrate from a first surface and is made of metal material to reflect light emitted from the at least one LED chip; and a gas barrier layer which covers the reflection layer. The at least one LED chip is bonded to the first surface of the ceramic substrate with a bonding part in between. The bonding part allows light emitted from the at least one LED chip to pass through the bonding part. The ceramic substrate has light diffusion and transmissive properties, and has a plan size larger than a plan size of the at least one LED chip. The reflection layer has a plan size smaller than a plan size of the ceramic substrate, and is formed so as to cover an area larger than a projected area of the at least one LED chip on the second surface of the ceramic substrate.

DESCRIPTION OF EMBODIMENTS

Figure 1:
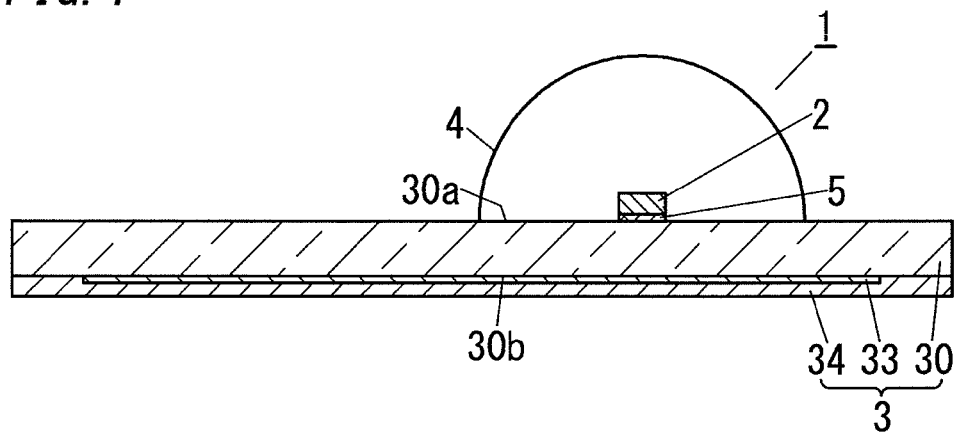
FIG. 1 is a schematic sectional view illustrating the light-emitting device according to the embodiment.
Figure 2:
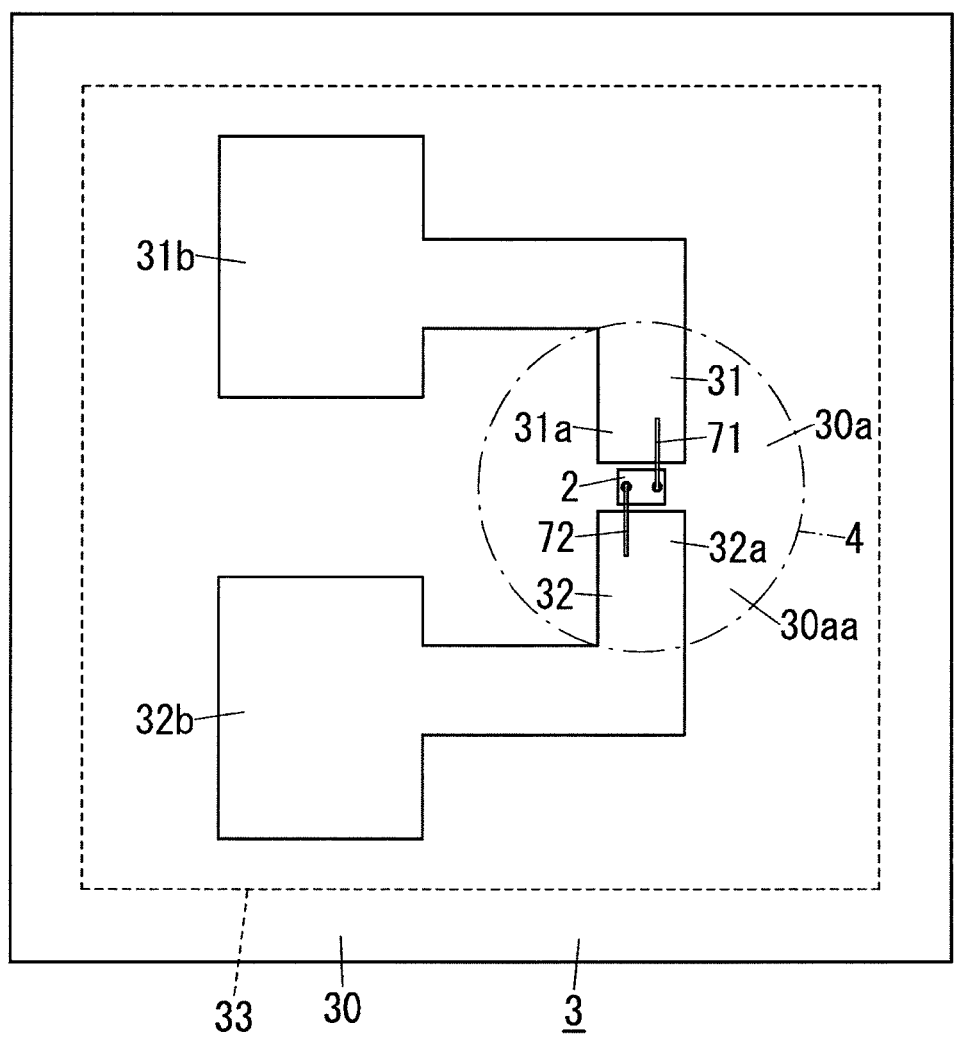
FIG. 2 is a schematic plan view illustrating the light-emitting device according to the embodiment.

The following explanations referring to FIG. 1 to FIG. 7 are made to a light-emitting device 1 of the present embodiment.

The light-emitting device 1 includes at least one LED chip 2, a mounting substrate 3 on which the at least one LED chip 2 is mounted, and a cover part 4 which covers the at least one LED chip 2 and allows light emitted from the at least one LED chip 2 to pass through the cover part 4. The mounting substrate 3 includes a ceramic substrate 30, a reflection layer 33 which is situated on a second surface 30b on the opposite side of the ceramic substrate 30 from a first surface 30a and is made of metal material to reflect light emitted from the at least one LED chip 2, and a gas barrier layer 34 covering the reflection layer 33. The at least one LED chip 2 is bonded to the first surface 30a of the ceramic substrate 30 with a bonding part 5 in between. The bonding part 5 allows light emitted from the at least one LED chip 2 to pass through the bonding part 5. The ceramic substrate 30 has light diffusion and transmissive properties and has a plan size larger than a plan size of the at least one LED chip 2. The reflection layer 33 has a plan size smaller than a plan size of the ceramic substrate 30 and is formed so as to cover an area 303 larger than a projected area 301 of the at least one LED chip 2 on the second surface 30b of the ceramic substrate 30.

In the light-emitting device 1, some of rays of light emitted from the LED chip 2 toward the ceramic substrate 30 are diffused inside the ceramic substrate 30 and thus emerge outside through an area 30aa that is the first surface 30a of the ceramic substrate 30 except a projected area of the LED chip 2 on the first surface 30a. Thereby, it is possible to improve the light-outcoupling efficiency of the light-emitting device 1. Further, the reflection layer 33 made of metal material is covered with the gas barrier layer 34 and thereby the reliability of the light-emitting device 1 can be improved.

The following is a detailed explanation made to each component of the light-emitting device 1.

Figure 5:
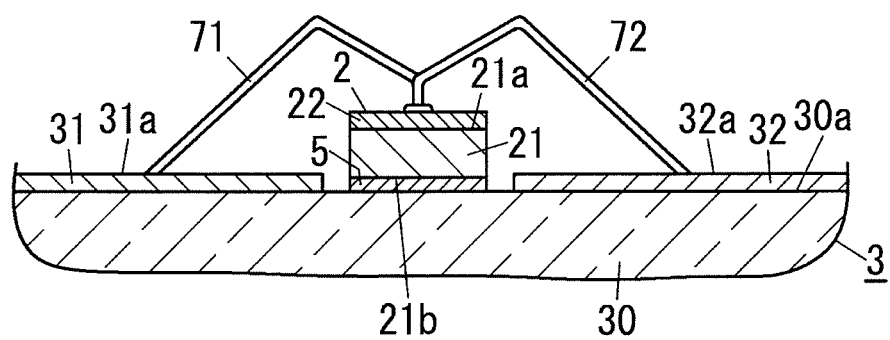
FIG. 5 is a schematic sectional view illustrating the primary part of the light-emitting device according to the embodiment.

As shown in FIG. 5, the LED chip 2 includes a substrate 21 and a multilayer film 22 made of semiconductor material on a first surface 21a of the substrate 21.

The multilayer film 22 includes a first conductivity type semiconductor layer and a second conductivity type semiconductor layer. The multilayer film 22 is formed so that the first conductivity type semiconductor layer is closer to the first surface 21a of the substrate 21 than the second conductivity type semiconductor layer is. In other words, the second conductivity type semiconductor layer is located on an opposite side of the first conductivity type semiconductor layer from the substrate 21. In the LED chip 2, the first conductivity type semiconductor layer is constituted by an n-type semiconductor layer, and the second conductivity type semiconductor layer is constituted by a p-type semiconductor layer. Alternatively, the LED chip 2 may be configured so that the first conductivity type semiconductor layer is constituted by a p-type semiconductor layer, and the second conductivity type semiconductor layer is constituted by an n-type semiconductor layer.

The substrate 21 serves to bear the multilayer film 22. The multilayer film 22 can be formed by an epitaxial growth method or the like. The epitaxial growth method may be a crystal growth method. Examples of the crystal growth method include a metal organic vapor phase epitaxy (MOVPE) method, a hydride vapor phase epitaxy (HVPE) method, a molecular beam epitaxy (MBE) method and the like. Note that, in the process of forming the multilayer film 22, impurities such as hydrogen, carbon, oxygen, silicon, and iron are inevitably contained in the multilayer film 22, and hence the multilayer film 22 is allowed to contain such impurities. For example, the substrate 21 can be constituted by a crystal growth substrate used for forming the multilayer film 22.

The LED chip 2 is a blue LED chip which is to emit blue light. In a case where the LED chip 2 is a GaN blue LED chip, the substrate 21 may be a GaN substrate, for example. The GaN blue LED chip is an LED chip in which semiconductor material of the multilayer film 22 is GaN material. Examples of the GaN material include GaN, AlGaN, InAlGaN and the like. It is sufficient that the substrate 21 is made of material allowing effective transmission of light emitted from the multilayer 22, and the substrate 21 is not limited to the GaN substrate, but may be a sapphire substrate or the like, for example. In other words, it is preferable that the substrate 21 is a substrate transparent for light emitted from the multilayer film 22.

The LED chip 2 may be configured so that the multilayer film 22 includes a buffer layer interposed between the substrate 21 and the first conductivity type semiconductor layer. The semiconductor material of the multilayer film 22 of the LED chip 2 is not particularly limited. Further, an emission wavelength of the LED chip 2 is not particularly limited. The LED chip 2 is not limited to the blue LED chip, but may be a violet LED chip to emit violet light, a green LED chip to emit green light, a red LED chip to emit red light or an ultraviolet LED chip to emit ultraviolet light.

It is preferable that the multilayer film 22 of the LED chip 2 include a light-emitting layer between the first conductivity type semiconductor layer and the second conductivity type semiconductor layer. In this structure, light emitted from the multilayer film 22 is light emitted from the light-emitting layer, and hence the emission wavelength of the multilayer film 22 is determined by material of the light-emitting layer. The light-emitting layer preferably has a single quantum well structure or a multiple quantum well structure, but not limited thereto. For example, in the LED chip 2, the first conductivity type semiconductor layer, the light-emitting layer and the second first conductivity type semiconductor layer may constitute a double heterostructure.

The structure of the first conductivity type semiconductor layer is not limited to a single layer structure, but may be a multilayer structure. Also, the structure of the second conductivity type semiconductor layer is not limited to a single layer structure, but may be a multilayer structure.

In the LED chip 2, the multilayer film 22 is partially removed by etching the multilayer film 22 from the surface to the middle of the first conductivity type semiconductor layer. In other words, the LED chip 2 has a mesa structure (not shown) formed by partially etching the multilayer film 22. Thereby, in the LED chip 2, there is a level difference between the surface of the second conductivity type semiconductor layer and the surface of the first conductivity type semiconductor layer.

Figure 4:
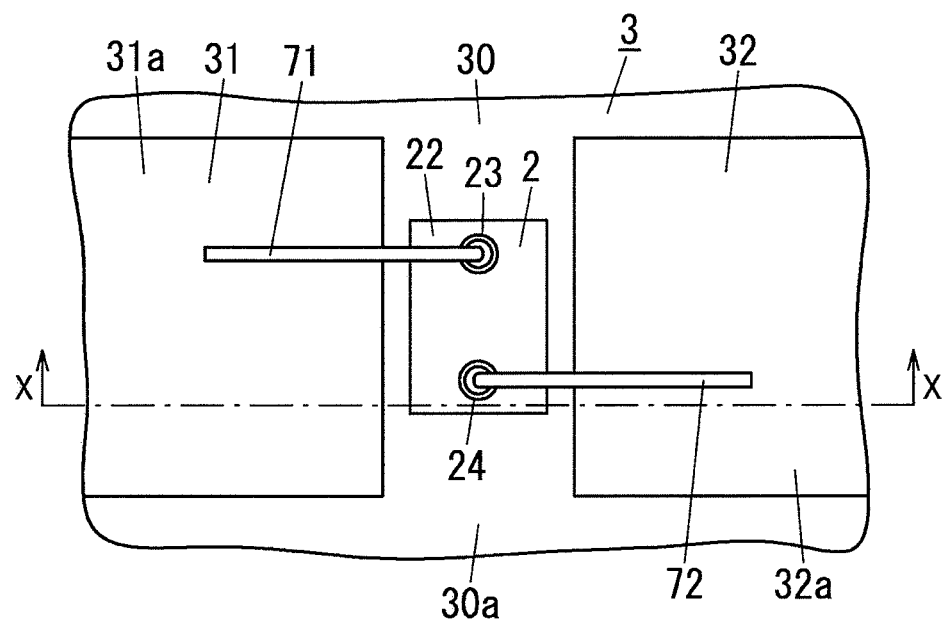
FIG. 4 is a schematic plan view illustrating the primary part of the light-emitting device according to the embodiment.

The LED chip 2 includes a first electrode 23 located on an exposed surface of the first conductivity type semiconductor layer, and a second electrode 24 located on the surface of the second conductivity type semiconductor layer (see FIG. 4). With regard to the LED chip 2, in a case where a conductivity type (first conductivity type) of the first conductivity type semiconductor layer is an n-type and a conductivity type (second conductivity type) of the second conductivity type semiconductor layer is a p-type, the first electrode 23 and the second electrode 24 serve as a negative electrode and a positive electrode, respectively. Alternatively, in a case where the first conductivity type is a p-type and the second conductivity type is an n-type, the first electrode 23 and the second electrode 24 serve as a positive electrode and a negative electrode, respectively. In either case, the LED chip 2 includes the first electrode 23 and the second electrode 24 on one surface in the thickness direction of the LED chip 2.

A chip size of the LED chip 2 is not particularly limited. In a case where a plan shape of the LED chip 2 is rectangular, for example, the LED chip 2 can have a chip size of 0.52 mm by 0.39 mm. Further, in a case where the plan shape of the LED chip 2 is square, for example, the LED chip 2 may have a chip size of 0.3 mm square (0.3 mm by 0.3 mm), 0.45 mm square (0.45 mm by 0.45 mm) or 1 mm square (1 mm by 1 mm). The plan shape and the chip size of the LED chip 2 are not limited.

The mounting substrate 3 is a substrate on which the LED chip 2 is mounted. The term "mount" is intended to mean that the LED chip 2 is placed and mechanically (physically) connected and also is electrically connected.

With regard to the mounting substrate 3, the LED chip 2 is placed on the first surface 30a of the ceramic substrate 30 with the bonding part 5 in between and, as a result, the LED chip 2 is physically connected to the ceramic substrate 30. It is preferable that material of the bonding part 5 has a high transmittance for light emitted from the LED chip 2. For example, the material of the bonding part 5 may be silicon resin, epoxy resin, or hybrid material of silicon resin and epoxy resin. Thereby, the bonding part 5 allows light emitted from the LED chip 2 to pass through the bonding part 5.

The mounting substrate 3 includes a first conductor part 31 and a second conductor part 32 on the first surface 30a of the ceramic substrate 30. The first electrode 23 and the second electrode 24 of the LED chip 2 are electrically connected to the first conductor part 31 and the second conductor part 32, respectively. The first conductor part 31 and the second conductor part 32 of the mounting substrate 3 are arranged in such a pattern that the first conductor part 31 and the second conductor part 32 are spatially separated from each other.

In the light-emitting device 1, the first electrode 23 of the LED chip 2 and the first conductor part 31 of the mounting substrate 3 are electrically connected to each other via a first wire 71. Also, in the light-emitting device 1, the second electrode 24 of the LED chip 2 and the second conductor part 32 of the mounting substrate 3 are electrically connected to each other via a second wire 72. The first wire 71 and the second wire 72 may be, for example, gold wire, silver wire, copper wire, or aluminum wire.

The first conductor part 31 includes a first connecting part 31a connected to the first wire 71 and a first terminal part 31b located outside the cover part 4 in a plan view. The second conductor part 32 includes a second connecting part 32a connected to the second wire 72 and a second terminal part 32b located outside the cover part 4 in a plan view. The first connecting part 31a, the second connecting part 32a, the first wire 71 and the second wire 72 are encapsulated by the cover part 4.

The first conductor part 31 and the second conductor part 32 each are constituted by a film stack of a Cu film, an Ni film, a Pd film and an Au film. Structures of the first conductor part 31 and the second conductor part 32 are not limited to the above, but may be a film stack of an Ni film and an Au film, a film stack of a Cu film, an Ni film and an Au film, or a film stack of a Ti film, a Pt film and an Au film. In a case where the first conductor part 31 and the second conductor part 32 are each constituted by a film stack, it is preferable that the uppermost film farthest from the ceramic substrate 30 be made of Au and that the downmost film closest to the ceramic substrate 30 be made of material having high adhesion to the ceramic substrate 30. The first conductor part 31 and the second conductor part 32 each are not limited to a stack film but may be a single layer film.

The ceramic substrate 30 includes the first surface 30a and the second surface 30b. For example, the first surface 30a and the second surface 30b are opposite (both) surfaces of the ceramic substrate 30 in a thickness direction of the ceramic substrate 30. For example, the ceramic substrate 30 is formed into a flat plate shape. A plan shape of the ceramic substrate 30 is square, but not limited thereto and may be, for example, rectangular, polygonal other than rectangular and square, circular or the like.

A plan size of the ceramic substrate 30 is set so as to be larger than a plan size of the LED chip 2. The plan size of the LED chip 2 means the chip size of the LED chip 2. Note that, the plan size means a size in a plane normal to the thickness direction (upward and downward direction in FIG. 1) of the light-emitting device 1.

In the light-emitting device 1, the LED chip 2 is bonded to an area for bearing the LED chip 2 of the first surface 30a of the ceramic substrate 30 with the bonding 5 in between. If the LED chip 2 can be bonded to the first surface 30a of the ceramic substrate 30 directly, the LED chip 2 or the ceramic substrate 30 serves as the bonding part 5.

The ceramic substrate 30 has light diffusion and transmissive properties to allow light emitted from the LED chip 2 to pass through the ceramic substrate 30 and to diffuse the light. Material of the ceramic substrate 30 may be light-transmissive ceramics. The light-transmissive ceramics may be, for example, alumina ceramics or the like. The light transmittance, the reflectance, the refraction index and the thermal conductivity of the light-transmissive ceramics are adjustable by selecting types or concentrations of a binder, an additive or the like.

It is preferable that the ceramic substrate 30 have a light diffusion property. Thereby, in the light-emitting device 1, light emitted from the LED chip 2 toward the ceramic substrate 30 is diffused inside the ceramic substrate 30. Therefore, the light-emitting device 1 can further prevent light emitted from the LED chip 2 toward the ceramic substrate 30 from returning to the LED chip 2 and thus the light can easily emerge outside through the area 30aa of the first surface 30a of the ceramic substrate 30 that does not include the projected area of the LED chip 2 on the first surface 30a. As a result, the light-outcoupling efficiency of the light-emitting device 1 can be improved and therefore an amount of total luminous flux can be increased.

The projected area of the LED chip 2 on the first surface 30a of the ceramic substrate 30 is a projection of the LED chip 2 on the first surface 30a of the ceramic substrate 30 in the thickness direction of the LED chip 2. With regard to the area 30aa which is the first surface 30a of the ceramic substrate 30 except the projected area of the LED chip 2, light is allowed to emerge outside through part on which the first conductor part 31 and the second conductor part 32 are not formed.

The ceramic substrate 30 can be constituted by, for example, an alumina substrate. A particle size of an alumina particle of the alumina substrate is set to approximately 0.6 μm. It is preferable that the particle size of each alumina particle of the alumina substrate be in a range of 0.5 μm to 5 μm. The reflectance of the alumina substrate tends to decrease with an increase in the particle size of the alumina particle, and a light scattering effect of the alumina substrate tends to increase with a decrease in the particle size of the alumina particle. In brief, this means a trade-off between a decrease in the reflectance and an increase in the light scattering effect.

The above-mentioned particle size can be derived from a particle size distribution curve based on the number of particles. In this regard, the particle size distribution curve based on the number of particles is obtained by measuring a particle size distribution by imaging. In detail, the particle size distribution curve based on the number of particles is derived from the size (mean diameter of two dimensions) and the number of particles obtained from a result of image processing on an SEM image obtained by measurement with a scanning electron microscope (SEM). A value of the particle size under a condition that an integrated value is 50% in the particle size distribution curve based on the number of particles is defined as a median diameter (d50), and the above-mentioned particle size is the median diameter.

Note that, in theory, the particle size and the reflectance of the spherical alumina particle in the alumina substrate have such a relationship that the reflectance tends to increase with a decrease in the particle size.

The reflection layer 33 is located on the second surface 30b of the ceramic substrate 30. The reflection layer 33 is formed so as to cover part of the second surface 30b.

Figure 3:
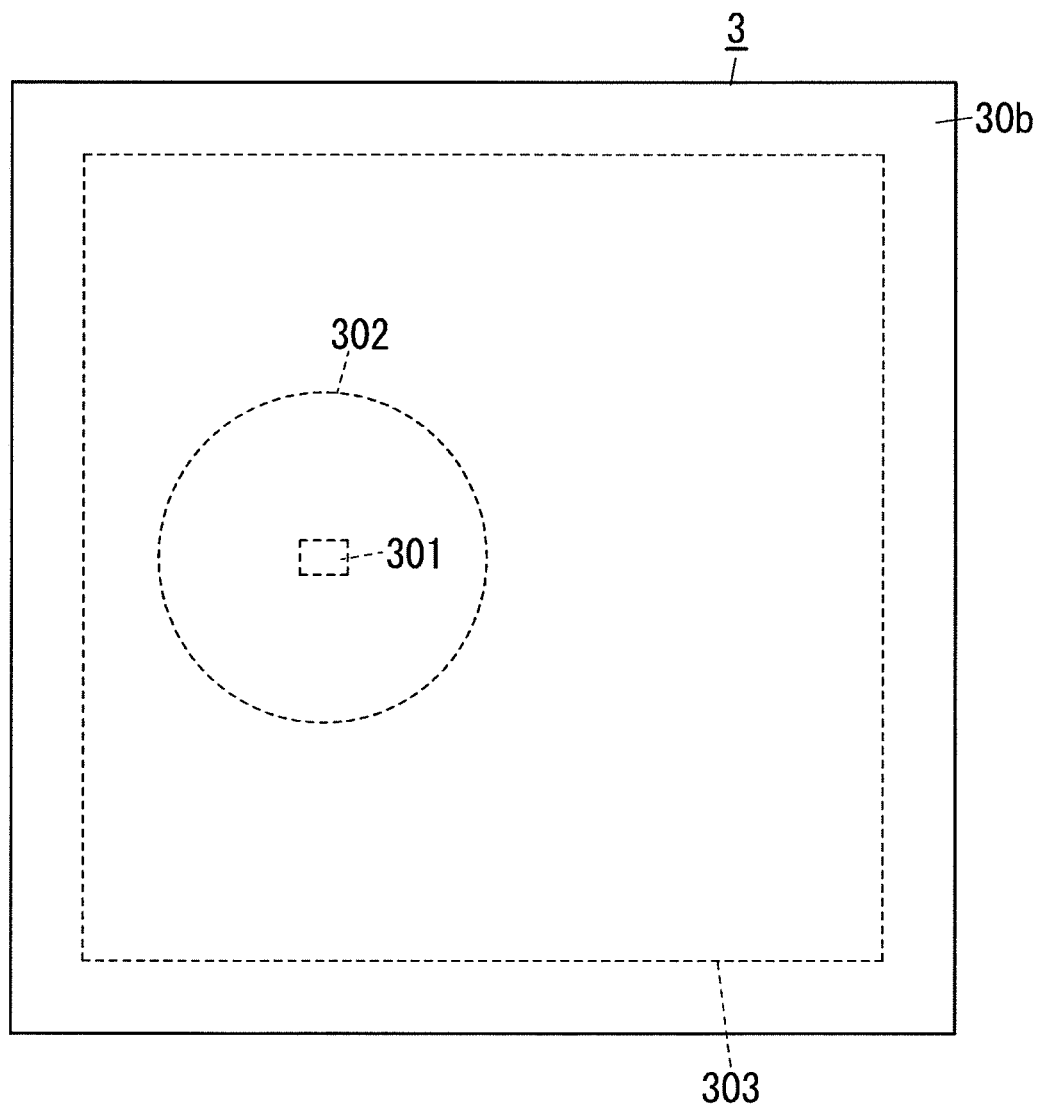
FIG. 3 is an explanatory view illustrating a relationship between sizes of the LED chip, the ceramic substrate, the reflection layer, and the cover part of the light-emitting device of the embodiment.

The reflection layer 33 is provided in order to reflect light which is emitted from the LED chip 2 and reaches the second surface 30b of the ceramic substrate 30. Therefore, as shown in FIG. 3, the reflection layer 33 is formed so as to cover an area larger than a projected area 301 of the LED chip 2 on the second surface 30b of the ceramic substrate 30. In other words, an area (formation area) 303, on which the reflection layer 33 is to be formed, of the second surface 30b is larger than the projected area (first projected area) 301. Further, preferably, the formation area 303 covers the whole of the projected area 301. In summary, the projected area 301 is positioned inside the formation area 303 and outer limits (peripheries) of the projected area 301 and the formation area 303 are not in contact with each other. Thereby, the light-emitting device 1 can efficiently reflect light which is emitted from the LED chip 2 and reaches the second surface 30b of the ceramic substrate 30.

In a case where the cover part 4 is made of a mixture of transparent material and wavelength conversion material, it is preferable that, as shown in FIG. 3, the reflection layer 33 is formed so as to cover an area larger than a projected area 302 of the cover part 4 on the second surface 30b of the ceramic substrate 30. In other words, the formation area 303 is larger than the projected area (second projected area) 302. Further, preferably, the formation area 303 covers the whole of the projected area 302. In summary, the projected area 302 is positioned inside the formation area 303 and outer limits (peripheries) of the projected area 302 and the formation area 303 are not in contact with each other. Thereby, the light-emitting device 1 can prevent light emitted from the LED chip 2 and reflected by the reflection layer 33 from emerging outside without passing through the cover part 4, and therefore can suppress color unevenness. The color unevenness means such a condition that chromaticity varies depending on a radiation direction of light.

Further, in view of heat dissipation performance, it is preferable that the reflection layer 33 of the light-emitting device 1 be formed so as to cover a larger area. Thereby, the light-emitting device 1 can transfer heat, which is generated in the LED chip 2 and is transferred to the reflection layer 33, to a larger area, and improve the heat dissipation performance more.

The reflection layer 33 has a plan size smaller than the ceramic substrate 30 and is disposed so as not to be in contact with the outer limit of the second surface 30b of the ceramic substrate 30. In other words, it is preferable that the formation area 303 be positioned inside the second surface 30b and the outer limits (peripheries) of the formation area 303 and the second surface 30b be not in contact with each other.

The projected area 301 of the LED chip 2 is a projection of the LED chip 2 in the thickness direction of the LED chip 2 (equal to the thickness direction of the light-emitting device 1) and in other words, i.e., a vertical projection of the LED chip 2 on the second surface 30b of the ceramic substrate 30. Further, the projected area 302 of the cover part 4 is a projection of the cover part 4 in the thickness direction of the light-emitting device 1 (equal to the thickness direction of the mounting substrate 3), i.e., a vertical projection of the cover part 4 on the second surface 30b of the ceramic substrate 30. Note that, the projected area 302 is larger than the projected area 301. Further, it is preferable that the projected area 301 be positioned inside the projected area 302 and the outer limits (peripheries) of the projected area 301 and the projected area 302 be not in contact with each other.

A plan shape of the reflection layer 33 is square, but not limited thereto and may be, for example, rectangular, polygonal other than rectangular and square, circular or the like.

It is preferable that metal material of the reflection layer 33 have high reflectance with respect to light emitted from the LED chip 2. In a case where light emitted from the LED chip 2 is visible, it is preferable that metal material of the reflection layer 33 be, for example, silver, a silver alloy, or the like. The reflection layer 33 is not limited to a single layer, but may be a stack film of a silver layer, a palladium layer, and a gold-silver alloy layer, for example.

The reflection layer 33 can be formed by a thin-film formation technique such as vapor deposition and sputtering, for example.

The gas barrier layer 34 serves as a protection layer to protect the reflection layer 33 by preventing the reflection layer 33 from being exposed to external gases.

The gas barrier layer 34 is formed so as to cover all of surfaces of the reflection layer 33 except a surface in contact with the second surface 30b of the ceramic substrate 30. In other words, the gas barrier layer 34 cooperates with the ceramic substrate 30 to enclose the reflection layer 33. In this manner, the reflection layer 33 is isolated from external air. Thereby, the light-emitting device 1 can suppress exposure of the reflection layer 33 to external air and thus can suppress corrosion of the reflection layer 33 caused by external air or the like. Therefore, the reliability of the light-emitting device 1 can be improved. Particularly, in a case where the metal material of the reflection layer 33 contains silver, the light-emitting device 1 can suppress sulfurization of the silver contained in the reflection layer 33 by sulfidizing gas or the like in the air, and thus can suppress age-related degradation of the reflectance of the reflection layer 33. Examples of the sulfidizing gas may include hydrogen sulfide and sulfur dioxide.

The gas barrier layer 34 is constituted by a metal oxide film. The metal oxide film is an aluminum oxide film, but not limited thereto and may be, for example, a titanium dioxide film, a ruthenium oxide, a zirconium oxide film, a molybdenum oxide film, a silicon oxide film or the like. The gas barrier layer 34 can be formed by a thin-film formation technique such as sputtering.

In the process of formation of the mounting substrate 3, for example, the reflection layer 33 is formed on the second surface 30b of the ceramic substrate 30, and subsequently the gas barrier layer 34 is formed to cover the second surface 30b of the ceramic substrate 30, and thereafter the first conductor part 31 and the second conductor part 32 are formed on the first surface 30a of the ceramic substrate 30.

The mounting substrate 3 is obtained by forming the reflection layer 33 and the gas barrier layer 34 by a thin-film formation technique, on the ceramic substrate 30 which is constituted by an alumina substrate formed by sintering at a sintering temperature of about 1550° C. to 1600° C. Thereby, even when the mounting substrate 3 has the same thickness as the LTCC substrate (low temperature co-fired ceramics substrate) including the silver layer therein, the mounting substrate 3 can have lower thermal resistance than the LTCC substrate. It is because the LTCC substrate is a substrate formed by sintering at 1000° C. or less (e.g., 850° C. to 1000° C.), which is relatively lower than the sintering temperature of the alumina substrate. Further, the mounting substrate 3 can give an advantage that the number of options of material of the reflection layer 33 is increased.

The cover part 4 is situated on the first surface 30a of the ceramic substrate 30 to cover the LED chip 2, the first wire 71 and the second wire 72. Thereby, the light-emitting device 1 includes a package constituted by the mounting substrate 3 and the cover part 4. Note that, the cover part 4 is optional.

The cover part 4 is formed into a hemisphere shape. A shape of the cover part 4 is not limited to a hemisphere shape, but may be a semi-ellipsoidal shape or a semi-cylindrical shape.

The cover part 4 also serves as an encapsulating part for encapsulating the LED chip 2, the first wire 71 and the second wire 72.

It is preferable that material of the cover part 4 be transparent material allowing light transmission. Examples of the transparent material may include silicon resin, epoxy resin, acrylic resin, glass, and organic and inorganic hybrid material.

The cover part 4 may be made of a mixture of transparent material allowing light transmission and wavelength conversion material converting a wavelength of part of light emitted from the LED chip 2 to emit light of a different wavelength. Thereby, the light-emitting device 1 can emit light of a mixed color constituted by light emitted from the LED chip 2 and light emitted from the wavelength conversion material.

It is preferable that the wavelength conversion material be fluorescent material which is to emit light having a different color from the LED chip 2 when excited by light emitted from the LED chip 2.

When, for example, the LED chip 2 is a blue LED chip and the fluorescent material is yellow fluorescent material, the light-emitting device 1 can emit white light. In other words, the light-emitting device 1 can provide blue light emitted from the LED chip 2 and light emitted from the yellow fluorescent material to the outside through the cover part 4 and thereby can give white light.

The fluorescent material is not limited to yellow fluorescent material, but may be, for example, a set of yellow fluorescent material and red fluorescent material, or a set of red fluorescent material and green fluorescent material. Further, the fluorescent material is not limited to one type of yellow fluorescent material, but may be a set of two types of yellow fluorescent material which have different emission wavelengths. When the wavelength conversion material contains different types of fluorescent material, the color rendering properties of the light-emitting device 1 can be improved.

It is preferable that a shape of the surface of the cover part 4 be designed such that an angle of a ray of light from the LED chip 2 to a normal direction at a point at which the ray of light intersects the surface of the cover part 4 is smaller than a critical angle. In this regard, it is preferable that the shape of the surface of the cover part 4 be designed such that, at almost every point of the surface of the cover part 4, an incident angle (light incident angle) of the ray of light from the LED chip 2 is smaller than the critical angle.

For this purpose, it is preferable that the cover part 4 be formed into, for example, a hemisphere shape. It is preferable that the cover part 4 of the light-emitting device 1 is designed such that an optical axis of the cover part 4 is coincident with an optical axis of the LED chip 2. Thereby, the light-emitting device 1 can achieve not only suppression of total reflection at the surface of the cover part 4 (the interface between the cover part 4 and air) but also suppression of color unevenness at the surface. The light-emitting device 1 can achieve suppression of color unevenness to such a degree that the color unevenness cannot be visually perceived.

Further, the light-emitting device 1 can substantially equalize lengths of light paths from the LED chip 2 to the surface of the cover part 4 irrespective of a radiation direction of light from the LED chip 2, and thereby can more suppress color unevenness. The shape of the cover part 4 is not limited to a hemisphere shape, but may be a semi-ellipsoidal shape.

In the light-emitting device 1, the cover part 4 may contain light diffusing material. It is preferable that the light diffusing material be particles dispersed in the cover part 4. When the cover part 4 contains the light diffusing material, the light-emitting device 1 can further suppress color unevenness. Material of the light diffusing material may be inorganic material, organic material, or organic and inorganic hybrid material. Examples of material of the inorganic material may include aluminum oxide, silica, titanium oxide, and gold. Examples of the organic material may include fluorine based resin. In the light-emitting device 1, an increase in a difference between the refractive indices of the light diffusing material and the transparent material of the cover part 4 may cause a decrease in a ratio of the light diffusion material which is necessary for providing an effect of suppressing the color unevenness to a desired degree.

When the LED chip 2 is a blue LED chip and material of the cover part 4 contains different types of fluorescent material (green fluorescent material, red fluorescent material) and light diffusing material, the light-emitting device 1 can further improve color rendering properties.

In the process of manufacture of the light-emitting device 1, first the mounting substrate 3 is prepared and thereafter the following first to third steps are performed sequentially.

In the first step, the LED chip 2 serving as a die is bonded on the first surface 30a of the ceramic substrate 30 by die-bonding with a die bonding device or the like. In other words, the LED chip 2 is bonded to the first surface 30a of the ceramic substrate 30 with the bonding part 5 in between.

In the second step, wire bonding is conducted with a wire bonding device or the like, so that the first electrode 23 and the second electrode 24 of the LED chip 2 are electrically connected to the first conductor part 31 and the second conductor part 32 via the first wire 71 and the second wire 72, respectively. In the third step, the cover part 4 is formed by use of a dispenser system or the like.

In view of efficiently dissipating heat generated in the LED chip 2 or the like, it is preferable that the mounting substrate 3 have smaller thermal resistance in the thickness direction of the mounting substrate 3.

Figure 6:
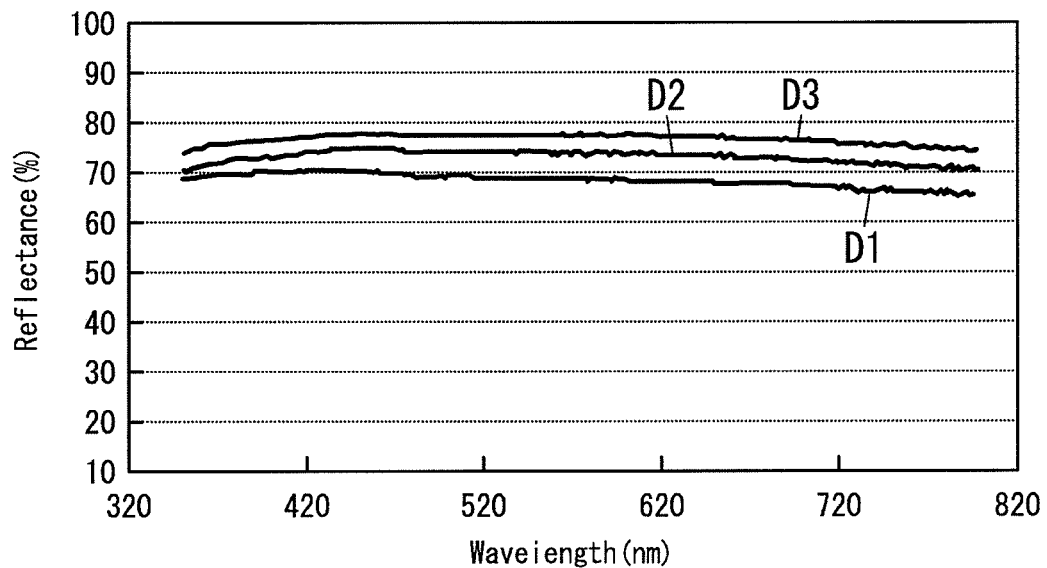
FIG. 6 is an explanatory diagram illustrating a relationship between a thickness of an alumina substrate and a reflectance of the alumina substrate.

The present inventors prepared a plurality of alumina substrates (trade name "A473" available from KYOCERA Corporation) having different thicknesses and measured reflectance of each alumina substrate. In FIG. 6, D1 indicates a measured value of reflectance of an alumina substrate with a thickness of 0.4 mm, D2 indicates a measured value of reflectance of an alumina substrate with a thickness of 0.6 mm and D3 indicates a measured value of reflectance of an alumina substrate with a thickness of 1 mm. The measured values of reflectance were obtained by measurement with an integrating sphere and a spectral photometer.

With respect to an alumina substrate, the thermal resistance in the thickness direction decreases with a decrease in the thickness. However, FIG. 6 shows that reflectance of the alumina substrate tends to decrease with a decrease in the thickness of the alumina substrate.

Figure 7:
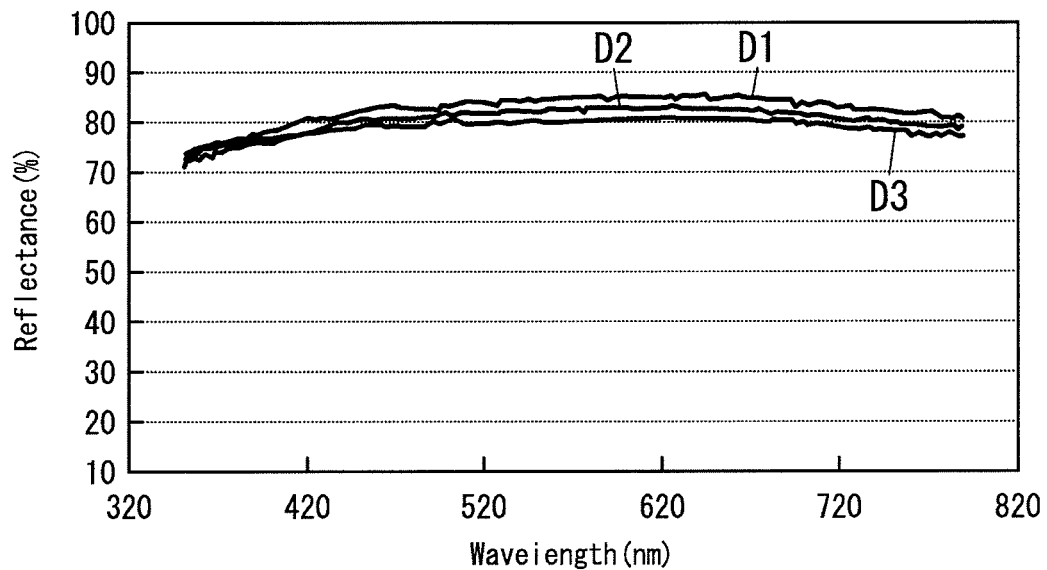
FIG. 7 is an explanatory diagram illustrating a relationship between a thickness of an alumina substrate of a stack of the alumina substrate and a silver layer and a reflectance of the stack.

Further, the present inventors prepared a plurality of alumina substrates (trade name "A473" available from KYOCERA Corporation) having different thicknesses, produced stacks each constituted by a silver layer and any one of the plurality of alumina substrates, and carried out an experiment to measure reflectance of each stack for light striking the alumina substrate. In FIG. 7, D1 indicates a measured value of reflectance of a stack of an alumina substrate with a thickness of 0.4 mm and a silver layer, D2 indicates a measured value of reflectance of a stack of an alumina substrate with a thickness of 0.6 mm and a silver layer and D3 indicates a measured value of reflectance of a stack of an alumina substrate with a thickness of 1 mm and a silver layer. The measured values of reflectance were obtained by measurement with an integrating sphere and a spectral photometer.

FIG. 7 shows that, in the case of the stack of the alumina substrate and the silver layer, the reflectance of the stack tends to increase with a decrease in the thickness of the alumina substrate. Further, FIGS. 6 and 7 show that a change in the reflectance of the stack of the alumina substrate and the silver layer tends to be smaller than the single alumina substrate in a change in the reflectance caused by a change in the thickness of the alumina substrate. In the stack, the thermal resistance in the thickness direction decreases with a decrease in the thickness of the alumina substrate.

In the light-emitting device 1 of the present embodiment, the mounting substrate 3 includes a stack of the ceramic substrate 30 and the reflection layer 33, and therefore it is possible to reduce the thermal resistance by thinning the mounting substrate 3. Additionally, it is possible to enable light emitted from the LED chip 2 to emerge outside efficiently.

Figure 8:
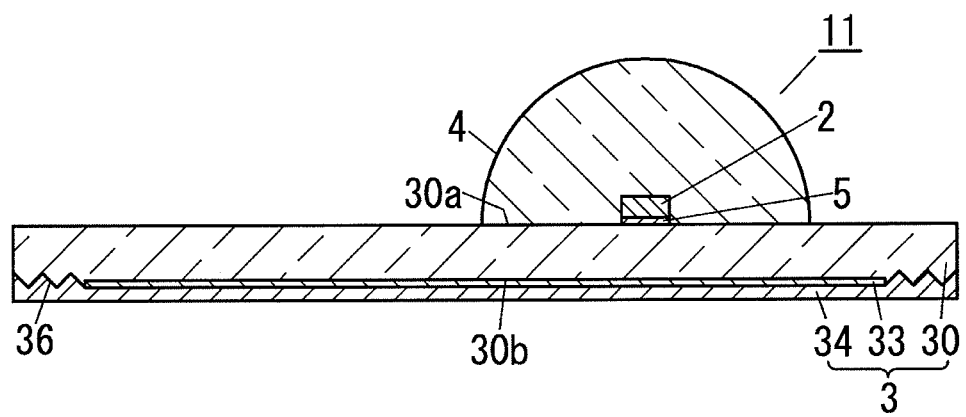
FIG. 8 is a schematic sectional view illustrating the first modification of the light-emitting device according to the embodiment.

FIG. 8 is a schematic sectional view illustrating a light-emitting device 11 of the first modification of the light-emitting device 1. The light-emitting device 11 has the same basic configuration as the light-emitting device 1, except an interface 36 between the ceramic substrate 30 and the gas barrier layer 34 of the light-emitting device 11 is uneven. Thus, a detailed explanation of the light-emitting device 11 is omitted. Note that components common to the light-emitting device 11 and the light-emitting device 1 are designated by the same reference signs.

The light-emitting device 11 includes an uneven structure at a periphery of the second surface 30b of the ceramic substrate 30 (in other words, the entire area of the second surface 30b except the area 303), and as a result the interface 36 between the ceramic substrate 30 and the gas barrier layer 34 becomes uneven.

In contrast to the light-emitting device 1, the light-emitting device 11 can improve adhesion of the ceramic substrate 30 and the gas barrier layer 34 and more increase a distance between the reflection layer 33 and the air along the interface 36 between the ceramic substrate 30 and the gas barrier layer 34. Thereby, the light-emitting device 11 can further suppress intrusion of sulfurous gas through a space between the ceramic substrate 30 and the gas barrier layer 34 relative to the light-emitting device 1. Consequently, the light-emitting device 11 can more suppress corrosion of the reflection layer 33 relative to the light-emitting device 1 and thus improve the reliability.

Figure 9:
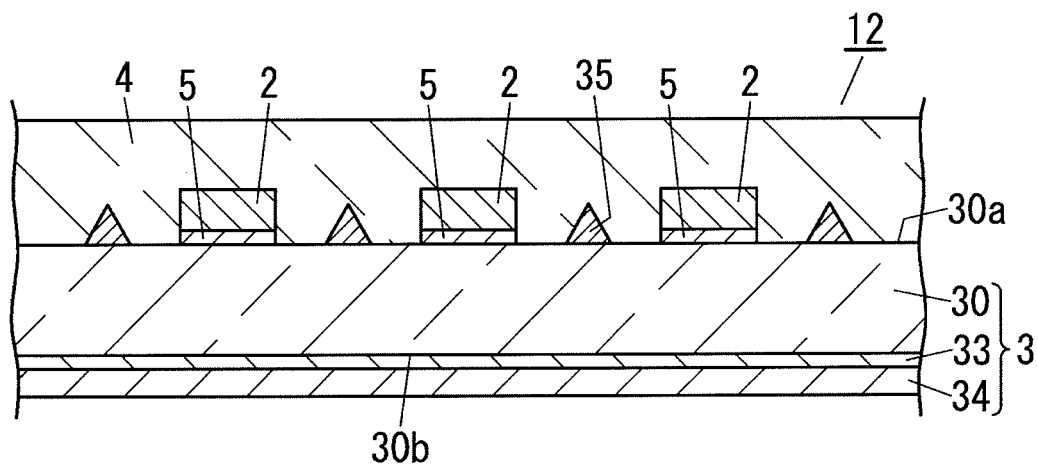
FIG. 9 is a schematic sectional view illustrating the primary part of the second modification of the light-emitting device according to the embodiment.
Figure 10:
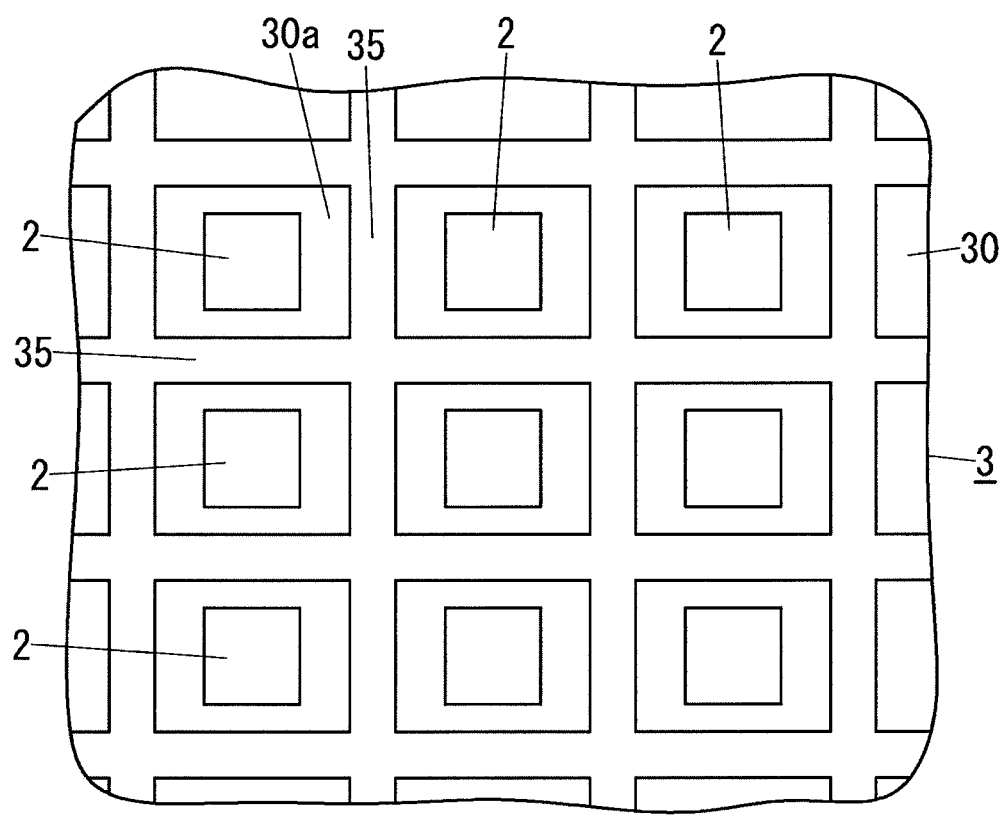
FIG. 10 is a schematic plan view illustrating the primary part of the second modification of the light-emitting device according to the embodiment.
Figure 11:
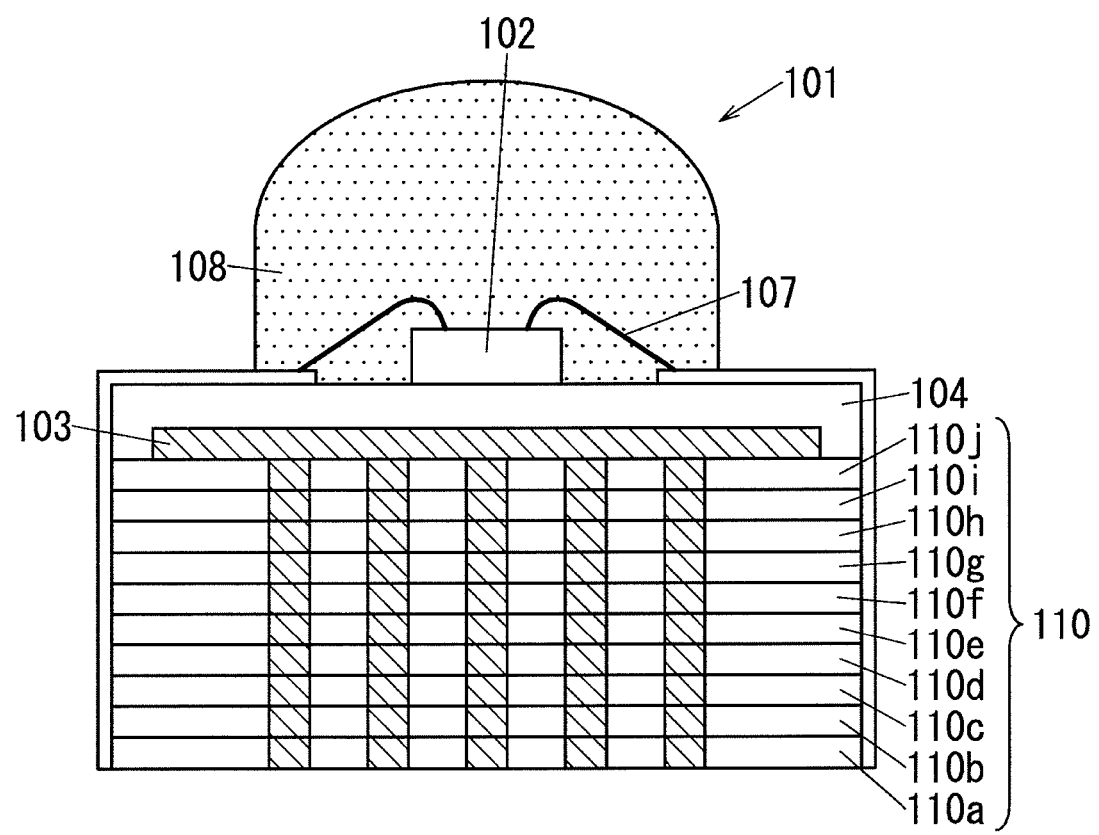
FIG. 11 is a schematic sectional view illustrating a conventional light-emitting device. The figures depict one or more implementation in accordance with the present teaching, by way of example only, not by way of limitations.

FIGS. 9 and 10 relate to a light-emitting device 12 of the second modification of the light-emitting device 1. As shown in FIGS. 9 and 10, the light-emitting layer 12 of the second modification includes a plurality of LED chips 2 mounted on the mounting substrate 3. Further, the light-emitting device 12 includes at least one protrusion 35 which protrudes from the first surface 30a of the ceramic substrate 30. The protrusion 35 is located between adjacent two of the plurality of LED chips 2 and away from the adjacent two of LED chips 2. The light-emitting device 12 has the almost same basic configuration as the light-emitting devices 1 and 11. Therefore, a detailed explanation of the light-emitting device 12 is omitted. Note that components common to the light-emitting device 12 and the light-emitting devices 1 and 11 are designated by the same reference signs.

A connection configuration of a plurality of the LED chips 2 of the light-emitting device 12 may be a series connection of the plurality of LED chips 2, a parallel connection of the plurality of LED chips 2 or a series-parallel connection of the plurality of LED chips 2. It is sufficient that the mounting substrate 3 includes a conductor part appropriately patterned depending on one selected from the above connection configurations. Note that in a case where, as shown in FIG. 10, an entire group of a plurality of protrusions 35 is given by a single grid shape member, the LED chips 2 may be electrically connected to each other via a wire. Further, the at least one protrusion 35 may be formed on a portion of the ceramic substrate 30 which does not overlap the conductor part for power supply to a group of the LED chips 2.

The plurality of LED chips 2 are mounted on the mounting substrate 3 of the light-emitting device 12 and therefore the light-emitting device 12 can be higher in light output than the light-emitting device 1.

Further, the light-emitting device 12 includes two or more LED chips 2 mounted on the mounting substrate 3 and at least one protrusion 35 formed to protrude from the first surface 30a of the ceramic substrate 30. The at least one protrusion 35 is situated between adjacent two of the two or more LED chips 2 and away from the adjacent two of the two or more LED chips 2. Therefore, the strength of the mounting substrate 3 can be improved.

It is preferable that the at least one protrusion 35 serves as a reflection part for reflecting light laterally emitted from the LED chip 2 in an intended light emerging direction. Hence, it is preferable that the side surfaces of the at least one protrusion 35 constitute light-reflecting surfaces. Thereby, the light-emitting device 12 can prevent unwanted situation where light laterally emitted from the LED chip 2 is reflected by the protrusion 35 and thus is returned to the LED chip 2. As a result, the light-outcoupling efficiency can be improved.

The side surface of the protrusion 35 is a flat shape, but not limited thereto and may be a curved surface or a stepped surface, for example. In a case where the side surface of the protrusion 35 of the mounting substrate 3 is flat, it is sufficient that an angle between the first surface 30a of the ceramic substrate 30 and the side surface of the protrusion 35 is appropriately selected from obtuse angles.

The LED chips 2 of the light-emitting device 12 are arranged in a two-dimensional array. However, arrangement of the LED chips 2 is not limited to such a two-dimensional array and for example the LED chips 2 may be arranged in a one-dimensional array.

The light-emitting device 12 includes one reflection layer 33 formed to have a size covering a whole of the projected areas 301 of the plurality of LED chips 2. Alternatively, the light-emitting device 12 may include a plurality of reflection layers 33 individually corresponding to the plurality of LED chips 2. In brief, the plurality of reflection layers 33 may be formed to have sizes covering the projected areas 301 of the plurality of LED chips 2 individually. Alternatively, the plurality of reflection layers 33 may include at least one reflection layer 33 covering a whole of the projected areas 301 of some of the plurality of LED chips 2 and at least one reflection layer 33 covering the projected area 301 of one of the plurality of LED chips 2.

It is preferable that the at least one protrusion 35 of the light-emitting device 12 be formed integrally with the ceramic substrate 30. Thereby, in contrast to a case where the at least one protrusion 35 is formed separately from the ceramic substrate 30 in advance but is finally bonded to the ceramic substrate 30, the mounting substrate 3 of the light-emitting device 12 can have the improved strength.

Note that, the figures used for describing the above embodiment and the like are schematic, and hence the sizes and the thicknesses of the components and the ratios thereof are not intended to show actual ones. Further, the material, the values and the like mentioned in the embodiment and the like are preferable examples, but not limited thereto. Further, appropriate changes to constitution of the present invention may be made without departing from the scope of the technical idea of the invention.

As apparent from the embodiment described above, the light-emitting device (1, 11, 12) of the first aspect in accordance with the present invention includes: at least one LED chip (2); a mounting substrate (3) on which the at least one LED chip (2) is mounted; and a cover part (4) which covers the at least one LED chip (2) and allows light emitted from the at least one LED chip (2) to pass through the cover part (4). The mounting substrate (3) includes: a ceramic substrate (30); a reflection layer (33) which is situated on a second surface (30b) on the opposite side of the ceramic substrate (30) from a first surface (30a) and is made of metal material to reflect light emitted from the at least one LED chip (2); and a gas barrier layer (34) which covers the reflection layer (33). The at least one LED chip (2) is bonded to the first surface (30a) of the ceramic substrate (30) with a bonding part (5) in between. The bonding part (5) allows light emitted from the at least one LED chip (2) to pass through the bonding part (5). The ceramic substrate (30) has light diffusion and transmissive properties and has a plan size larger than a plan size of the at least one LED chip (2). The reflection layer (33) has a plan size smaller than a plan size of the ceramic substrate (30) and is formed so as to cover an area (303) larger than a projected area (301) of the at least one LED chip (2) on the second surface (30b) of the ceramic substrate (30).

In the light-emitting device (1, 11, 12), some of rays of light emitted from the LED chip (2) toward the ceramic substrate (30) are diffused inside the ceramic substrate (30) and thus emerge outside through the area (30aa) that is the first surface (30a) of the ceramic substrate (30) except the projected area of the LED chip (2) on the first surface (30a). Thereby, it is possible to improve the light-outcoupling efficiency of the light-emitting device (1, 11, 12). Further, the reflection layer (33) made of metal material is covered with the gas barrier layer (34) and thereby the reliability of the light-emitting device (1, 11, 12) can be improved.

According to the light-emitting device (1, 11, 12) of the second aspect in accordance with the present invention referring to the first aspect, the ceramic substrate (30) is an alumina substrate.

According to the light-emitting device (11) of the third aspect in accordance with the present invention referring to the first or second aspect, an interface (36) between the ceramic substrate (30) and the gas barrier layer (34) is uneven.

According to the light-emitting device (12) of the fourth aspect in accordance with the present invention referring to any one of the first to third aspects, the light-emitting device (12) includes two or more LED chips (2) mounted on the mounting substrate (3) and at least one protrusion (35) formed to protrude from the first surface (30a) of the ceramic substrate (30). The at least one protrusion (35) is situated between adjacent two of the two or more LED chips (2) and away from the adjacent two of the two or more LED chips (2).

According to the light-emitting device (12) of the fifth aspect in accordance with the present invention referring to the fourth aspect, the at least one protrusion (35) is formed integrally with the ceramic substrate (30).

According to the light-emitting device (1, 11, 12) of the sixth aspect in accordance with the present invention referring to any one of the first to fifth aspects, the cover part (4) is made of a mixture of transparent material allowing light transmission and wavelength conversion material converting a wavelength of part of light emitted from the at least one LED chip (2) to emit light of a different wavelength.

According to the light-emitting device (1, 11, 12) of the seventh aspect in accordance with the present invention referring to the sixth aspect, the wavelength conversion material is fluorescent material which is to emit light having a different color from the at least one LED chip (2) when excited by light emitted from the at least one LED chip (2).

According to the light-emitting device (1, 11, 12) of the eighth aspect in accordance with the present invention referring to the sixth or seventh aspect, the reflection layer (33) is formed so as to cover an area (303) larger than a projected area (302) of the cover part (4) on the second surface (30b) of the ceramic substrate (30).

While the foregoing has described what are considered to be the best mode and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

The invention claimed is:

1. A light-emitting device comprising:
   at least one LED chip;
   a mounting substrate on which the at least one LED chip is mounted; and
   a cover part which covers the at least one LED chip and allows light emitted from the at least one LED chip to pass through the cover part,
   the mounting substrate including;
      a ceramic substrate;
      a reflection layer which is situated on a second surface on the opposite side of the ceramic substrate from a first surface and is made of metal material to reflect light emitted from the at least one LED chip; and
      a gas barrier layer which covers the reflection layer,
   the at least one LED chip being bonded to the first surface of the ceramic substrate with a bonding part in between,
   the bonding part allowing light emitted from the at least one LED chip to pass through the bonding part,
   the ceramic substrate having light diffusion and transmissive properties and having a plan size larger than a plan size of the at least one LED chip, and
   the reflection layer having a plan size smaller than a plan size of the ceramic substrate and being formed so as to cover an area larger than a projected area of the at least one LED chip on the second surface of the ceramic substrate.

2. The light-emitting device according to claim 1, wherein the ceramic substrate is an alumina substrate.

3. The light-emitting device according to claim 1, wherein an interface between the ceramic substrate and the gas barrier layer is uneven.

4. The light-emitting device according to claim 1, wherein the light-emitting device comprises two or more LED chips mounted on the mounting substrate and at least one protrusion formed to protrude from the first surface of the ceramic substrate, the at least one protrusion being situated between adjacent two of the two or more LED chips and away from the adjacent two of the two or more LED chips.

5. The light-emitting device according to claim 4, wherein the at least one protrusion is formed integrally with the ceramic substrate.

6. The light-emitting device according to claim 1, wherein the cover part is made of a mixture of transparent material allowing light transmission and wavelength conversion material converting a wavelength of part of light emitted from the at least one LED chip to emit light of a different wavelength.

7. The light-emitting device according to claim 6, wherein the wavelength conversion material is fluorescent material which is to emit light having a different color from the at least one LED chip when excited by light emitted from the at least one LED chip.

8. The light-emitting device according to claim 6, wherein the reflection layer is formed so as to cover an area larger than a projected area of the cover part on the second surface of the ceramic substrate.

* * * * *